United States Patent
Blaes et al.

(10) Patent No.: US 10,712,368 B2
(45) Date of Patent: Jul. 14, 2020

(54) DEVICE FOR INTEGRATED CURRENT MEASUREMENT INSIDE A HIGH-VOLTAGE CONTACT OF A HYBRID MODULE

(71) Applicant: Schaeffler Technologies AG & Co. KG, Herzogenaurach (DE)

(72) Inventors: Cédric Blaes, Munchhausen (FR); Vincent Leonhardt, Haguenau (FR)

(73) Assignee: SCHAEFFLER TECHNOLOGIES AG & CO. KG, Herzogenaurach (DE)

(*) Notice: Subject to any disclaimer, the term of this patent is extended or adjusted under 35 U.S.C. 154(b) by 254 days.

(21) Appl. No.: 15/549,859

(22) PCT Filed: Feb. 10, 2016

(86) PCT No.: PCT/DE2016/200084
§ 371 (c)(1),
(2) Date: Aug. 9, 2017

(87) PCT Pub. No.: WO2016/131455
PCT Pub. Date: Aug. 25, 2016

(65) Prior Publication Data
US 2018/0031612 A1 Feb. 1, 2018

(30) Foreign Application Priority Data
Feb. 16, 2015 (DE) .................. 10 2015 202 770

(51) Int. Cl.
*G01R 15/20* (2006.01)
*G01R 31/327* (2006.01)
(Continued)

(52) U.S. Cl.
CPC ......... *G01R 15/202* (2013.01); *G01R 15/207* (2013.01); *H01R 13/6683* (2013.01); *H01R 12/75* (2013.01); *H01R 2201/20* (2013.01)

(58) Field of Classification Search
CPC ...... G01R 15/20; G01R 31/327; G01R 33/06; G01R 33/07; G01R 33/09; G01R 13/66
See application file for complete search history.

(56) References Cited

U.S. PATENT DOCUMENTS

| 4,470,041 A | 9/1984 | Sutherland et al. |
| 6,472,878 B1 * | 10/2002 | Bruchmann ......... G01R 15/202 324/117 H |

(Continued)

FOREIGN PATENT DOCUMENTS

| CN | 103069283 A | 4/2013 |
| CN | 103081167 A | 5/2013 |

(Continued)

OTHER PUBLICATIONS

English Translation of International Search Report for PCT/DE2016/200084; 2 pgs; dated Jun. 6, 2016 by the European Patent Office.

*Primary Examiner* — Neel D Shah
(74) *Attorney, Agent, or Firm* — LeKeisha M. Suggs

(57) ABSTRACT

A device for integrated current measurement inside a high-voltage contact-making means of a hybrid module includes a printed circuit board with at least one current sensor chip that is arranged on the printed circuit board. The device further includes a high-voltage contact-making plug connection, which is mounted on the printed circuit board. The high-voltage contact-making plug connection has at least one Hall ring and one busbar that is passed through the Hall ring, wherein the Hall ring has an open cross section and the sensor chip is at least partially accommodated in the open cross section.

13 Claims, 2 Drawing Sheets

(51) Int. Cl.
*G01R 33/06* (2006.01)
*G01R 33/07* (2006.01)
*G01R 33/09* (2006.01)
*H01R 13/66* (2006.01)
H01R 12/75 (2011.01)

(56) References Cited

U.S. PATENT DOCUMENTS

| | | | |
|---|---|---|---|
| 7,583,072 B2 * | 9/2009 | Muraki | G01R 15/207 |
| | | | 324/117 H |
| 2005/0057016 A1 * | 3/2005 | Martinez | B60N 2/2887 |
| | | | 280/124.152 |
| 2008/0094060 A1 | 4/2008 | Muraki | |
| 2009/0184714 A1 * | 7/2009 | Tigwell | G01R 33/3804 |
| | | | 324/318 |
| 2013/0214593 A1 * | 8/2013 | Ohashi | B60R 16/03 |
| | | | 307/10.1 |
| 2014/0357126 A1 * | 12/2014 | Suzuki | H01R 13/6683 |
| | | | 439/620.01 |
| 2015/0042324 A1 * | 2/2015 | Fujita | G01R 19/0092 |
| | | | 324/244 |

FOREIGN PATENT DOCUMENTS

| | | |
|---|---|---|
| CN | 103635817 A | 3/2014 |
| CN | 104160284 A | 11/2014 |
| DE | 112012002846 T5 | 4/2014 |
| JP | H1097879 A | 4/1998 |

\* cited by examiner

DEVICE FOR INTEGRATED CURRENT MEASUREMENT INSIDE A HIGH-VOLTAGE CONTACT OF A HYBRID MODULE

CROSS-REFERENCE TO RELATED APPLICATIONS

This application is the U.S. National Phase of PCT Appln. No. PCT/DE2016/200084 filed Feb. 10, 2016, which claims priority to DE 102015202770.8 filed Feb. 16, 2015, the entire disclosures of which are incorporated by reference herein.

TECHNICAL FIELD

The present disclosure relates to a device for integrated current measurement inside a high-voltage contact-making means of a hybrid module. The disclosure further relates to a hybrid module having the device.

BACKGROUND

Current measurement is an important part of a converter. In all converters, the currents of motor phases are measured in order to thereby establish regulation. The prior art discloses carrying out the current measurement by means of external current sensors. The degree of efficiency of a drive depends on the accuracy of this measurement.

One disadvantage with the prior art is that the known current sensors cannot be integrated within a high-voltage contact-making means since these electronic components require a large amount of installation space and specific current guidance. In addition, the accuracy of the current measurement depends on the design of the components and it is extremely difficult to ensure a high degree of accuracy over the entire measurement range of the current sensors. Therefore, the degree of efficiency of the drive is impaired, mainly in the case of relatively small currents.

The technical object is therefore to overcome the disadvantages of the prior art. The aim is to develop a space-saving concept in which current measurement can be performed inside a high-voltage contact-making means in a very precise manner.

SUMMARY

According to the disclosure, the object is achieved, in particular, by a device for integrated current measurement inside a high-voltage contact-making means of a hybrid module, having
  a printed circuit board with at least one current sensor chip which is arranged on the printed circuit board, and
  a high-voltage contact-making plug connection which is mounted on the printed circuit board,
wherein the high-voltage contact-making plug connection has at least one Hall ring and one busbar which is passed through the Hall ring, wherein the Hall ring has an open cross section and the sensor chip is at least partially accommodated in the open cross section.

By virtue of providing the Hall ring with the open cross section for accommodating the sensor chip, integrated current measurement inside the high-voltage contact-making means can be configured to be as compact as possible. As a result, current measurement can be performed in an extremely precise manner. All voltages and current ranges can be measured in a simple manner.

An open cross section is preferably intended to be understood to mean a cross section which is not closed. Therefore, the Hall ring has an interruption in its annularly continuous geometry.

The Hall ring preferably functions in accordance with the principle of the Hall effect. Here, the Hall effect describes the production of an electrical voltage in an electrical conductor through which current is flowing and which is located in a stationary magnetic field. In this case, the voltage is dropped across the conductor perpendicular to the direction of current flow and also to the direction of the magnetic field and is called the Hall voltage. The Hall effect therefore occurs in a conductor through which current is flowing and which is located in a magnetic field, wherein an electric field builds up, said electric field being perpendicular to the current direction and to the magnetic field and compensating for the Lorentz force acting on the electrons. The Hall ring is preferably composed of a ferromagnetic material.

An "open loop Hall effect" can preferably be produced by means of the open Hall ring. The degree of current measurement accuracy can be optimized by virtue of providing the Hall ring.

The sensor chip is preferably soldered or welded on the printed circuit board. Three plugs, three sensors and three Hall rings are preferably provided for the device.

The device is preferably in the form of a contact-making interface.

The printed circuit board is preferably a circuit board. The printed circuit board is preferably a fully integrated system which serves to drive an electric motor and to generate power.

As an alternative, a 48 V contact-making means can preferably be provided instead of the high-voltage contact-making means. The high-voltage contact-making plug connection can then accordingly be formed as a 48 V contact-making plug connection.

In a further embodiment according to the disclosure, a first end of the busbar bears against a current supply element which is arranged on the printed circuit board.

The current supply element is preferably soldered or welded on the printed circuit board. The current supply element is preferably designed to conduct current from a power electronics system, via the busbar in the direction of the printed circuit board, to the electric motor.

The current supply element is preferably arranged in the region of the current sensor chip.

The first end of the busbar preferably bears flat, that is to say in a planar manner, against one side of the current supply element. A contact area is particularly preferably formed between the current supply element and the busbar.

In a further embodiment according to the disclosure, the busbar has a second end which is connected to a plug.

In this way, a plug connection to the AC phases (the stator busbars) of the electric motor can be formed. This allows compact and quick assembly which is advantageous in respect of the process.

In a further embodiment according to the disclosure, both the first end of the busbar has an opening and the current supply element has an opening.

In a further embodiment according to the disclosure, at least one of the openings is in the form of an elongate hole.

Owing to the provision of the elongate hole, a height difference between the current supply element of the printed circuit board and the high-voltage contact-making plug connection can be equalized in a simple manner. Therefore, tolerances can be equalized in a simple manner.

In a further embodiment according to the disclosure, a connecting element is passed through the opening in the current supply element and through the opening in the first end of the busbar for the purpose of fixing the high-voltage contact-making plug connection to the printed circuit board.

Therefore, it is possible to connect the printed circuit board to the high-voltage contact-making plug connection in a simple manner.

In a further embodiment according to the disclosure, the connecting element is a screw or a rivet.

The connecting element is preferably a screw, with preference a pin or bolt with an external thread. The openings preferably have an internal thread. Therefore, the screw can be screwed into the openings in a simple manner.

Owing to the provision of a rivet, it is possible to quickly fix the connecting element to the first end of the busbar.

In a further embodiment according to the disclosure, a screw nut is provided, which screw nut is arranged on a side of the first end of the busbar which is situated opposite the current supply element, wherein the connecting element is designed as a screw and is passed through the opening in the current supply element and through the opening in the busbar and is screwed to the screw nut.

In the process, the screw is first passed through the opening in the current supply element and then through the opening in the busbar in order to then be screwed to the screw nut.

It is likewise possible to connect the printed circuit board to the high-voltage contact-making plug connection in this way.

The screw nut preferably has an internal thread. Therefore, the openings do not require an internal thread. The screw nut is preferably connected to the first end of the busbar. The screw nut is particularly preferably welded to the first end of the busbar.

In a further embodiment according to the disclosure, the busbar and the Hall ring are at least partially arranged in a plastic housing of the high-voltage contact-making plug connection.

A sealing arrangement which prevents the ingress of dirt and water can be produced in this way.

According to the disclosure, the object is further achieved, in particular, by a hybrid module having a device as described above.

The hybrid module preferably has a power electronics system. The device is preferably arranged inside the power electronics system.

The stator busbars are preferably connected to the plugs of the device by means of a plug-in process in order to allow current and/or voltage to be transferred to the electric motor of the hybrid module.

BRIEF DESCRIPTION OF THE DRAWINGS

The disclosure will now be illustrated, by way of example, by figures, in which.

DETAILED DESCRIPTION

Figure 1:
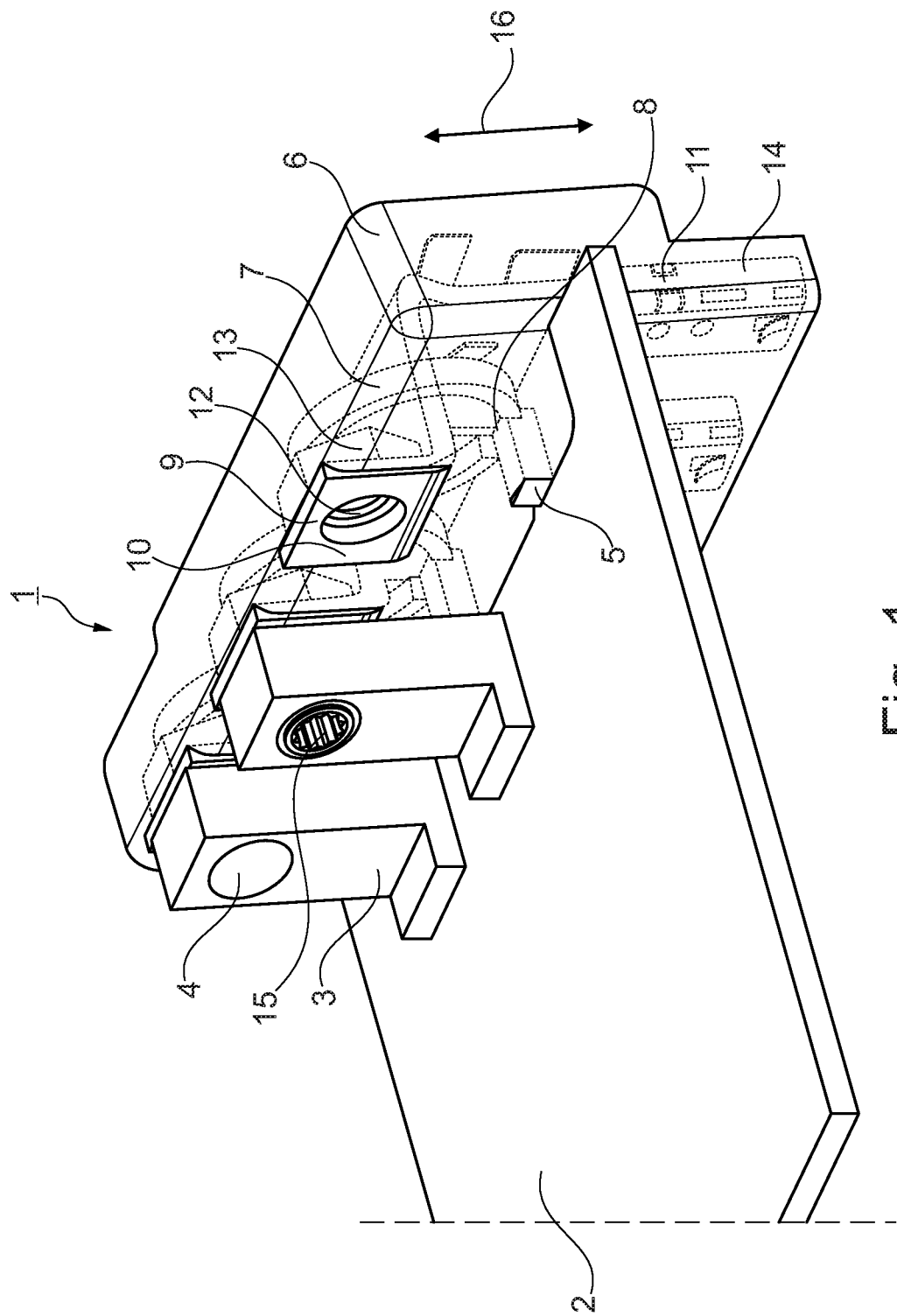
FIG. 1 shows a schematic view of a device according to embodiments of the disclosure.

The device 1 is provided for integrated current measurement inside a high-voltage contact-making means of a hybrid module. The device 1 has a printed circuit board 2 which is in the form of a circuit board. Three current sensor chips 5 are arranged on the printed circuit board 2. The device 1 also has a high-voltage contact-making plug connection 6 which is mounted on the printed circuit board 2. The high-voltage contact-making plug connection 6 has, in accordance with the number of current sensor chips 5, three Hall rings 7 and in each case one busbar 9 which is passed through the Hall rings 7. The Hall rings 7 have an open cross section 8. An open cross section intended to be understood to mean a cross section which is not closed. The sensor chips 5 are at least partially accommodated in the open cross section 8.

The high-voltage contact-making plug connection 6 has the three busbars 9. A first end 10 of each busbar 9 bears against a current supply element 3. The current supply elements 3 are arranged on the printed circuit board 2 in the region of the current sensor chips 5. The current supply elements 3 are welded on the printed circuit board 2. In this case, the first end 10 of the busbars 9 bears flat, that is to say in a planar manner, against one side of the current supply elements 3.

The busbars 9 also have a second end 11. The second ends 11 of the busbars 9 have plugs 14.

The first ends 10 of the busbars 9 have openings 12. The current supply elements 3 likewise have openings 4. The openings 4 in the current supply elements 3 are in the form of elongate holes.

A height difference arising between the current supply element 3 on the printed circuit board 2 and the high-voltage contact-making plug connection 6 can be equalized in a simple manner after the high-voltage contact-making plug connection 6 has been mounted onto the printed circuit board 2.

Screw nuts 13 are arranged in the region between the first ends 10 of the busbars 9 and the Hall rings 7. Each screw nut 13 is arranged on a side of the first end 10 of the busbar 9 which is situated opposite the current supply element 3.

Connecting elements are provided in order to fix the printed circuit board 2 to the high-voltage contact-making plug connection 6, only one connecting element 15 from amongst said connecting elements being shown in FIG. 1.

The connecting element 15 is first passed through the opening 4 in the current supply element 3 and then through the opening 12 in the busbar 9 in order to then be screwed to the screw nut 13. In this case, the connecting element 15 is designed as a screw.

The busbars 9, the Hall rings 7 and the screw nuts 13 are at least partially arranged in a plastic housing of the high-voltage contact-making plug connection 6. A sealing arrangement which prevents the ingress of dirt and water can be produced in this way.

Owing to the provision of the Hall ring with the open cross section for receiving the sensor chip, integrated current measurement inside the high-voltage contact-making means can be configured to be as compact as possible. Therefore, current measurement can be performed in an extremely precise manner.

Figure 2:
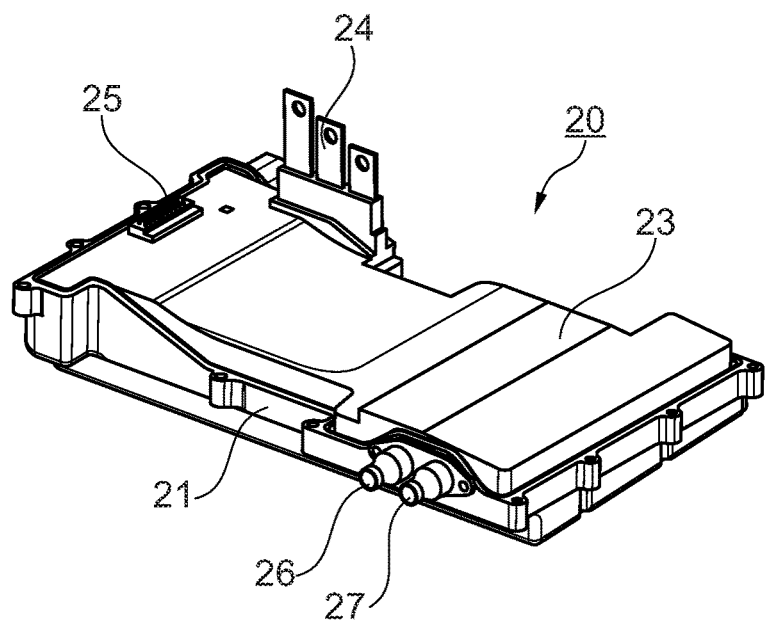
FIG. 2 shows a schematic view of an integrated power electronics system.

FIG. 2 shows a schematic view of an integrated power electronics system.

The power electronics system 20 has a power electronics system housing lower part 21, wherein power output stage modules (not illustrated) are arranged in the power electronics system housing lower part 21. A cooling cover 23 is also inserted into the power electronics system housing lower part 21 and mounted onto the power output stage modules. A control module, a power board and a current sensor system (not illustrated) are further arranged in the power electronics system housing lower part 21. The power electronics system housing lower part 21 has connections 26, 27 for supplying coolant to and discharging coolant from the cooling cover 23.

The power electronics system 20 also has a sensor system connection 25 and three stator busbars 24.

The power electronics system 20 has the device 1 (not shown), as described with respect to FIG. 1. The stator busbars 24 are connected to the contact-making means, which is present in the printed circuit board 2, by means of a plugging operation by way of the plugs 14 of the device 1 in order to allow current and/or voltage to be transferred to the electric motor of a hybrid module.

Figure 3:
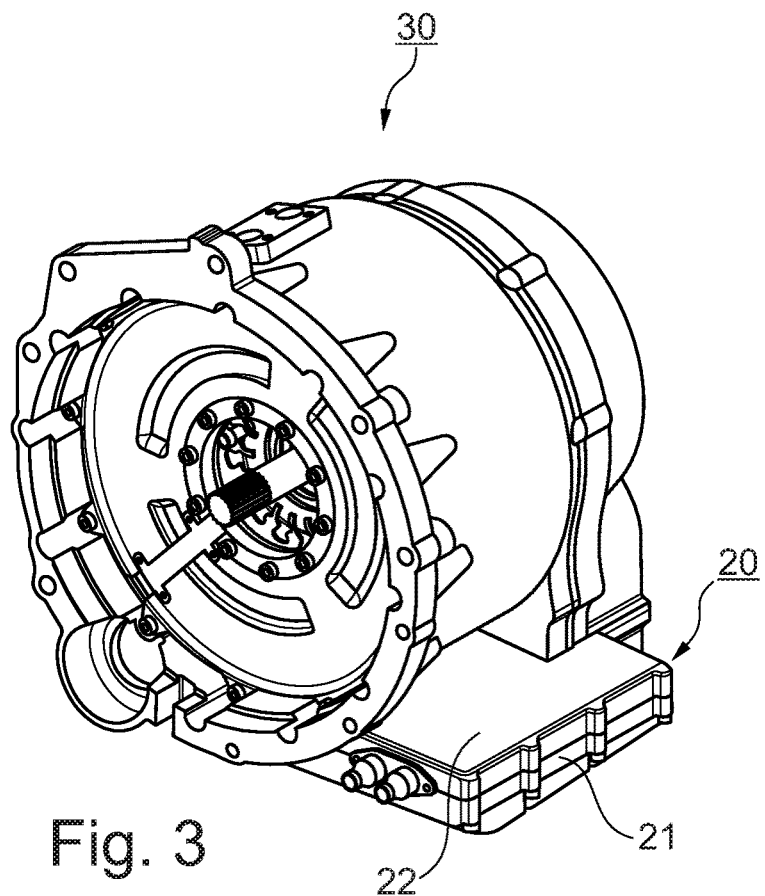
FIG. 3 shows a schematic view of a hybrid module according to embodiments of the disclosure.

FIG. 3 shows a schematic view of a hybrid module according to the disclosure.

The hybrid module 30 has the power electronics system 20, shown in FIG. 2, with the device 1.

The power electronics system 20 which is integrated into the power electronics system housing lower part 21 according to FIG. 2 is closed by means of the power electronics system housing upper part 22 of the hybrid module 30.

LIST OF REFERENCE CHARACTERS

1 Device
2 Printed circuit board
3 Current supply element
4 Opening
5 Current sensor chip
6 High-voltage contact-making plug connection
7 Hall ring
8 Open cross section
9 Busbar
10 First end
11 Second end
12 Opening
13 Screw nut
14 Plug
15 Fastening means
16 Direction
20 Power electronics system
21 Power electronics system housing lower part
22 Power electronics system housing lower part
23 Cooling cover
24 Stator busbars
25 Sensor system connection
26 Connection
27 Connection
30 Hybrid module

The invention claimed is:

1. A device for integrated current measurement inside a high-voltage contact of a hybrid module, comprising:
a printed circuit board having a current sensor chip and a current supply element arranged on the printed circuit board; and
a high-voltage contact-making plug connection which is mounted on the printed circuit board,
wherein the high-voltage contact-making plug connection has at least one Hall ring and at least one busbar which is passed through the Hall ring, wherein the Hall ring has an open cross section and the current sensor chip is at least partially accommodated in the open cross section,
wherein a connecting element is passed through an opening in the current supply element and through an opening in a first end of the busbar to fix the high-voltage contact-making plug connection to the printed circuit board.

2. The device of claim 1, wherein the first end of the busbar bears against the current supply element.

3. The device of claim 2, wherein the busbar has a second end which is connected to a plug.

4. The device of claim 1, wherein at least one of the openings is in a form of an elongate hole.

5. The device of claim 1, wherein the connecting element is a screw or a rivet.

6. The device of claim 1, wherein a screw nut is provided, the screw nut being arranged on a side of the first end of the busbar which is situated opposite the current supply element, wherein the connecting element is a screw and is passed through the opening in the current supply element and through the opening in the busbar and is screwed to the screw nut.

7. The device of claim 1, wherein the busbar and the Hall ring are at least partially arranged in a plastic housing of the high-voltage contact-making plug connection.

8. A hybrid module comprising the device of claim 1.

9. A device for integrated current measurement inside a high-voltage contact of a hybrid module, comprising:
a circuit board having a current sensor chip;
a plug connection mounted on the circuit board, the plug connection having a Hall ring and a busbar that is passed through the Hall ring, wherein the Hall ring has an open cross section and the current sensor chip is disposed within the open cross section;
a current supply element arranged on the circuit board, wherein a first end of the busbar bears against a side of the current supply element to form a contact area therebetween; and
a connecting element disposed within an opening defined in the current supply element and within an opening defined in the first end of the busbar to connect the plug connection to the circuit board.

10. The device of claim 9 wherein the current supply element is soldered or welded on the circuit board.

11. The device of claim 9 wherein the current supply element is configured to conduct current from a power electronics system via the busbar to an electric motor.

12. The device of claim 9 wherein the busbar has a second end connected to a plug.

13. A power electronics system comprising the device of claim 9 and including:
a power electronics system housing lower part; and
a cooling cover inserted into the power electronics system housing lower part, wherein the power electronics system housing lower part includes at least one connection for supplying coolant to the cooling cover and discharging coolant therefrom.

* * * * *